(12) United States Patent
Shiau et al.

(10) Patent No.: US 10,881,025 B1
(45) Date of Patent: Dec. 29, 2020

(54) ELASTIC HEAT-DISSIPATION STRUCTURE AND ELECTRONIC DEVICE

(71) Applicant: CTRON Advanced Material Co., Ltd., Xinxiang (CN)

(72) Inventors: Yi-Hau Shiau, Xinxiang (CN); Ming-Hsiang He, Xinxiang (CN)

(73) Assignee: CTRON ADVANCED MATERIAL CO., LTD., Xinxiang (CN)

( * ) Notice: Subject to any disclaimer, the term of this patent is extended or adjusted under 35 U.S.C. 154(b) by 0 days.

(21) Appl. No.: 16/590,650

(22) Filed: Oct. 2, 2019

(30) Foreign Application Priority Data

Jul. 1, 2019 (CN) .......................... 2019 1 0583746

(51) Int. Cl.
*H05K 7/20* (2006.01)

(52) U.S. Cl.
CPC ..... *H05K 7/20454* (2013.01); *H05K 7/20463* (2013.01)

(58) Field of Classification Search
CPC ........... H05K 7/20454; H05K 7/20463; H05K 1/0203; H05K 7/20963; H05K 7/20481; H05K 7/209; H01L 2924/00; H01L 23/367; H01L 2224/05599; H01L 23/36; H01L 23/373; H01L 23/3737; H01L 2225/06589; H01L 23/34; H01L 2924/0665; H01L 2225/1094; H01M 10/647; F28F 13/00; F28F 21/02; G06F 1/1605; G06F 1/1626; G06F 1/20; G06F 1/206; F28D 15/0233; F28D 1/02
USPC ......... 361/704, 709, 718, 719; 257/E23.102, 257/E23.107, E23.087, 712, 717, E23.11; 165/104.33
See application file for complete search history.

(56) References Cited

U.S. PATENT DOCUMENTS

2016/0300777 A1* 10/2016 Hong .................. H01L 23/3733

* cited by examiner

*Primary Examiner* — Mandeep S Buttar
(74) *Attorney, Agent, or Firm* — Muncy, Geissler, Olds & Lowe, P.C.

(57) ABSTRACT

An elastic heat-dissipation structure comprises a porous elastic member, a plurality of first thermal conductive members, and a plurality of second thermal conductive members. The first thermal conductive members and the second thermal conductive members are mixed in the porous elastic member. Each first thermal conductive member has a maximum width ranged from 5 μm to 50 μm, each second thermal conductive member has a maximum width ranged from 0 μm to 5 μm, and the thicknesses of each first thermal conductive member and each second thermal conductive member ranges from 0.3 nm to 30 nm. When the density of the elastic heat-dissipation structure is between 0.1 g/cm$^3$ and 1.0 g/cm$^3$, the contained percentages of the first thermal conductive members and the second thermal conductive members range from 0.01% to 20%. An electronic device containing the elastic heat-dissipation structure is also disclosed.

17 Claims, 7 Drawing Sheets

ELASTIC HEAT-DISSIPATION STRUCTURE AND ELECTRONIC DEVICE

CROSS REFERENCE TO RELATED APPLICATIONS

This Non-provisional application claims priority under 35 U.S.C. § 119(a) on Patent Application No(s). 201910583746.2 filed in People's Republic of China on Jul. 1, 2019, the entire contents of which are hereby incorporated by reference.

BACKGROUND

Technology Field

The present disclosure relates to an elastic heat-dissipation structure and an electronic device having the same.

Description of Related Art

As the progress of technology, the design and development of flat-panel electronic devices, such as display panels, backlight modules, or lighting modules, are mostly focused on thinner, larger, and high-performance products. However, when the products become thinner, larger, and high-performance, more heat is inevitably generated than before. Therefore, the "heat dissipation" function is already an indispensable demand function of the electronic device.

Conventionally, the generated waste heat is dissipated by configuring the heat sink, fan, or heat dissipation member (such as heat pipes) on the device. The heat sink or fins generally have a certain thickness, and are made of a metal material having high thermal conductivity or the polymer composite material doped with an inorganic material having high thermal conductivity, such as boron nitride, aluminum nitride, or the like. However, the metal material with high thermal conductivity has a high density, which increases the overall weight and thickness. The structural strength of the polymer composite material doped with inorganic materials is not good enough for some products.

Therefore, it is an important subject to provide a structure for the heat dissipation of electronic devices, which can be applied to the products in various fields so as to achieve the requirements of thin, large and high performance.

SUMMARY

An objective of the present disclosure is to provide an elastic heat-dissipation structure and an electronic device having the elastic heat-dissipation structure. The elastic heat-dissipation structure can achieve the heat dissipation requirement, absorb the vibration generated by the operation device, and satisfy the requirements of thin, large and high performance.

To achieve the above, the present disclosure provides an elastic heat-dissipation structure, which comprises a porous elastic member, a plurality of first thermal conductive members and a plurality of second thermal conductive members. The first thermal conductive members and the second thermal conductive members are mixed in the porous elastic member. Each of the first thermal conductive members has a maximum width greater than 5 µm and less than or equal to 50 µm, and each of the second thermal conductive members has a maximum width greater than 0 µm and less than or equal to 5 µm. The thickness of each of the first thermal conductive members and each of the second thermal conductive members is greater than or equal to 0.3 nm and less than or equal to 30 nm. When a density of the elastic heat-dissipation structure is greater than or equal to 0.1 g/cm$^3$ and less than or equal to 1.0 g/cm$^3$, the contained percentages of the first thermal conductive members and the second thermal conductive members are greater than or equal to 0.01% and less than or equal to 20%. When the density of the elastic heat-dissipation structure is greater than 1 g/cm$^3$ and less than or equal to 2 g/cm$^3$, the contained percentages of the first thermal conductive members and the second thermal conductive members are greater than 20% and less than or equal to 40%. When the density of the elastic heat-dissipation structure is greater than 2 g/cm$^3$ and less than or equal to 4 g/cm$^3$, the contained percentages of the first thermal conductive members and the second thermal conductive members are greater than 40% and less than or equal to 50%. When the density of the elastic heat-dissipation structure is greater than 4 g/cm$^3$ and less than or equal to 10 g/cm$^3$, the contained percentages of the first thermal conductive members and the second thermal conductive members are greater than 50% and less than or equal to 60%.

To achieve the above, the present disclosure also provides an electronic device, which comprises a heat source and an elastic heat-dissipation structure. The elastic heat-dissipation structure is disposed on a surface of the heat source and comprises a porous elastic member, a plurality of first thermal conductive members and a plurality of second thermal conductive members. The first thermal conductive members and the second thermal conductive members are mixed in the porous elastic member. Each of the first thermal conductive members has a maximum width greater than 5 µm and less than or equal to 50 µm, and each of the second thermal conductive members has a maximum width greater than 0 µm and less than or equal to 5 µm. The thickness of each of the first thermal conductive members and each of the second thermal conductive members is greater than or equal to 0.3 nm and less than or equal to 30 nm. When a density of the elastic heat-dissipation structure is greater than or equal to 0.1 g/cm$^3$ and less than or equal to 1.0 g/cm$^3$, contained percentages of the first thermal conductive members and the second thermal conductive members are greater than or equal to 0.01% and less than or equal to 20%. When the density of the elastic heat-dissipation structure is greater than 1 g/cm$^3$ and less than or equal to 2 g/cm$^3$, the contained percentages of the first thermal conductive members and the second thermal conductive members are greater than 20% and less than or equal to 40%. When the density of the elastic heat-dissipation structure is greater than 2 g/cm$^3$ and less than or equal to 4 g/cm$^3$, the contained percentages of the first thermal conductive members and the second thermal conductive members are greater than 40% and less than or equal to 50%. When the density of the elastic heat-dissipation structure is greater than 4 g/cm$^3$ and less than or equal to 10 g/cm$^3$, the contained percentages of the first thermal conductive members and the second thermal conductive members are greater than 50% and less than or equal to 60%.

In one embodiment, a material of the porous elastic member comprises acrylic resin, polyurethane, polyethylene, or polypropylene, or any combination thereof.

In one embodiment, a material of the first thermal conductive member or the second thermal conductive member comprises graphene, graphite, carbon nanotube, aluminum oxide, zinc oxide, titanium oxide, or boron nitride, or any combination thereof.

In one embodiment, when a total amount of the first thermal conductive members and the second thermal conductive members is 100%, a percentage of the first thermal conductive members in the total amount is between 5% and 95%.

In one embodiment, the elastic heat-dissipation structure further comprises a first surface and a second surface opposite to the first surface, the porous elastic member comprises a plurality of pores, and a part of the pores are communicated with an environment through the pores disposed on the first surface or the second surface.

In one embodiment, the elastic heat-dissipation structure further comprises a first surface and a second surface opposite to the first surface, the porous elastic member comprises a plurality of pores, the pores are disposed between the first surface and the second surface and are not communicated with an environment, and a part of the pores are communicated with each other.

In one embodiment, the elastic heat-dissipation structure further comprises a first surface and a second surface opposite to the first surface, the porous elastic member comprises a plurality of pores, the pores are disposed between the first surface and the second surface and are not communicated with an environment, and the pores are isolated from each other.

In one embodiment, the porous elastic member comprises a plurality of pores, and the first thermal conductive members and the second thermal conductive members are disposed around the pores for maintaining the pores.

In one embodiment, the electronic device is an LED display device, an OLED display device, an LCD device, a backlight module, an LED lighting module, or an OLED lighting module.

As mentioned above, in the elastic heat-dissipation structure and the electronic device of this disclosure, the first thermal conductive members and the second thermal conductive members are mixed and disposed inside the porous elastic member, and the limiting property of the first thermal conductive members and the second thermal conductive members can quickly dissipate the heat generated by the heat source to the environment. Moreover, the elastic heat-dissipation structure can also absorb the vibrations in a single point, a partial area or a plane, thereby achieving heat dissipation and damping functions. In addition, the elastic heat-dissipation structure of this disclosure can satisfy the requirements of thin, large and high performance for the electronic device.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The elastic heat-dissipation structure of the present application can be applied to, for example but not limited to, a mobile phone, a notebook computer, a tablet computer, a television, a display device, a backlight module, or a lighting module, or an electronic device in other fields, and this disclosure is not limited. In addition to the high thermal conduction and heat dissipation benefits, the elastic heat-dissipation structure of the present application can absorb the vibration generated by the operating device, and can be applied to different product fields to meet the requirements of thin, large and high-performance electronic devices. In addition, the elastic heat-dissipation structure of the present application may be disposed on the surface of the heat source to guide and transfer the heat generated by the heat source through the elastic heat-dissipation structure, and then to dissipate the heat through, for example, the back plate, the back cover, or a casing of the electronic device, or through any of other components that can carry or guide the heat source.

Figure 1A:
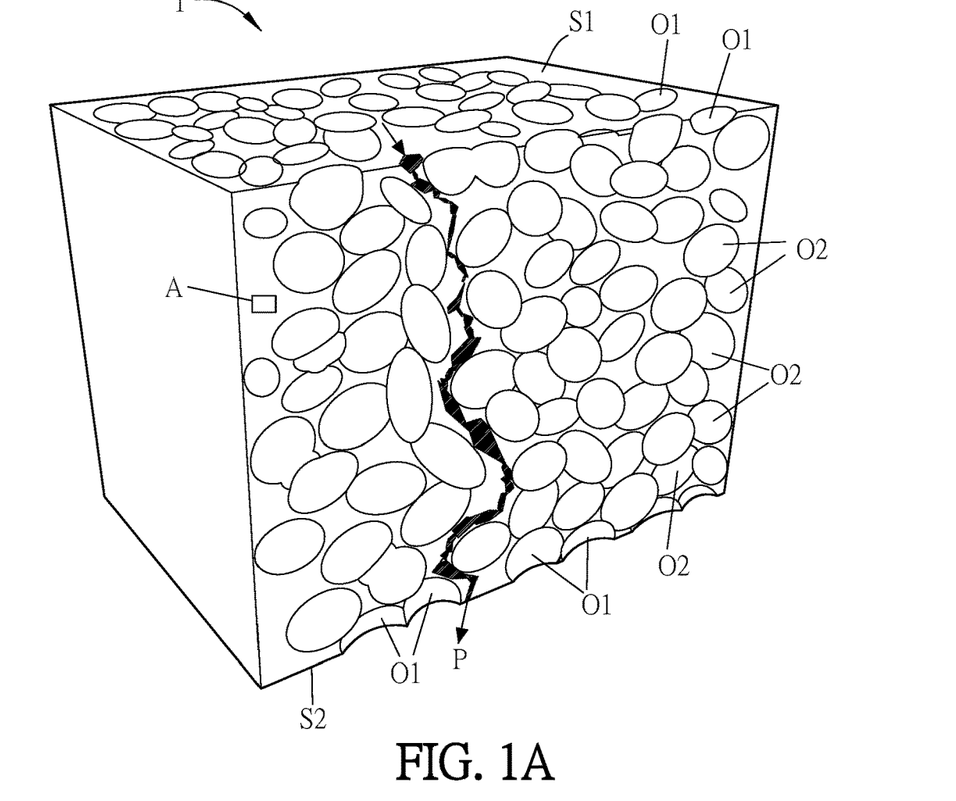
FIG. 1A is a partial sectional view of an elastic heat-dissipation structure according to an embodiment of this disclosure.
Figure 1B:
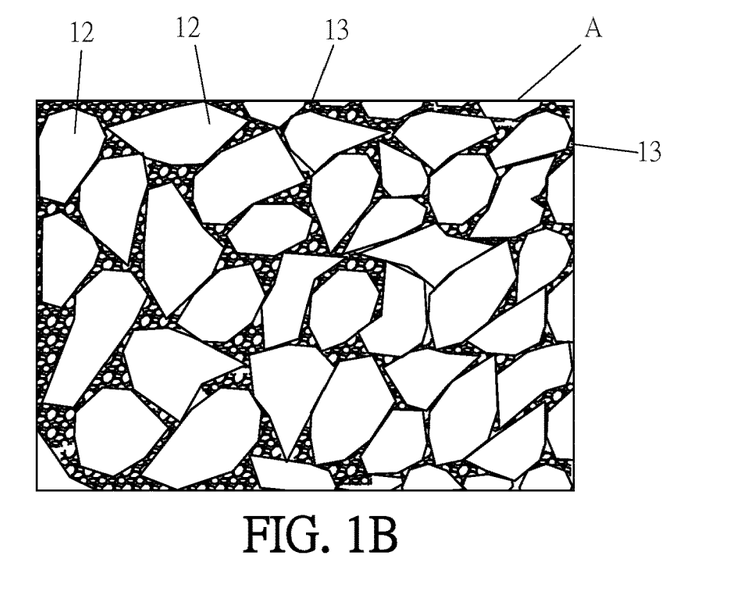
FIG. 1B is an enlarged view of the area A of FIG. 1A.
Figure 2:
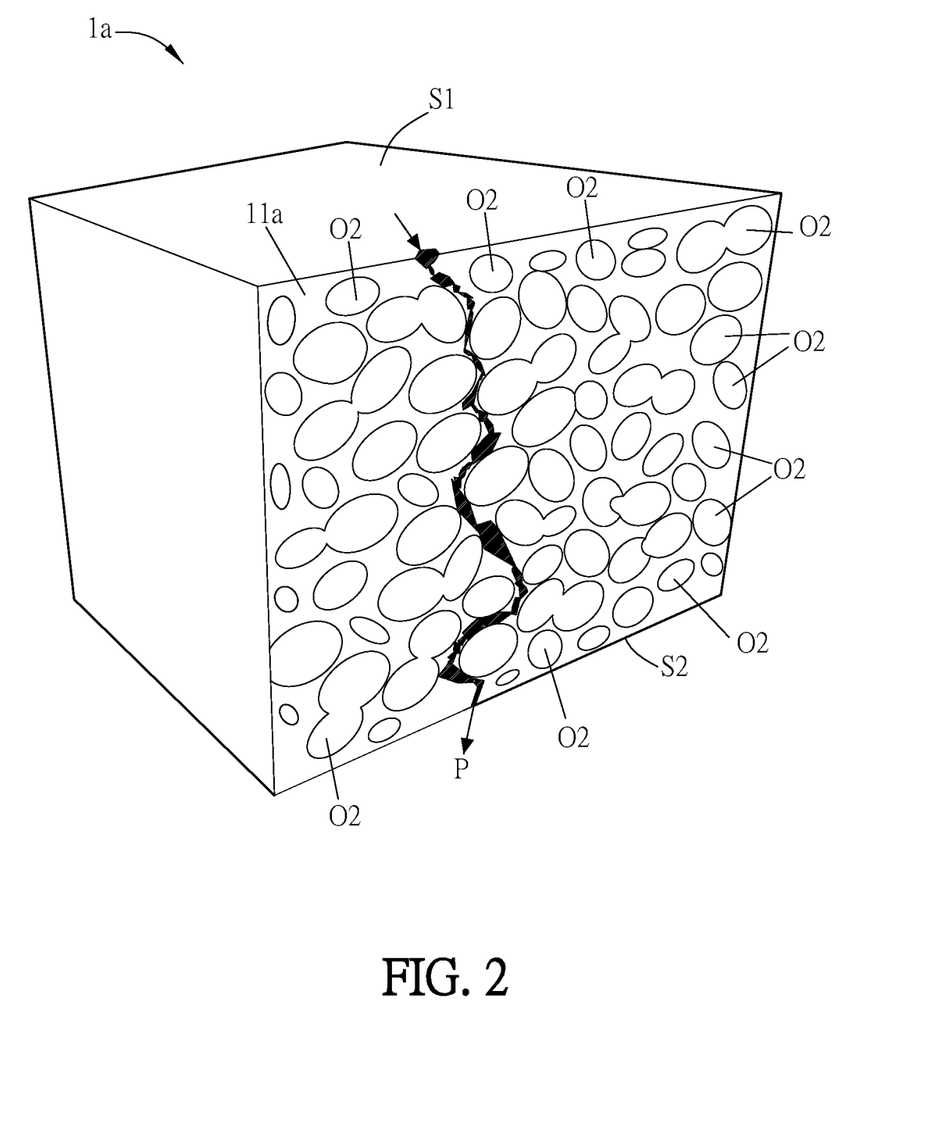
FIGS. 2 and 3 are partial sectional views of elastic heat-dissipation structures according to different embodiments of this disclosure.
Figure 3:
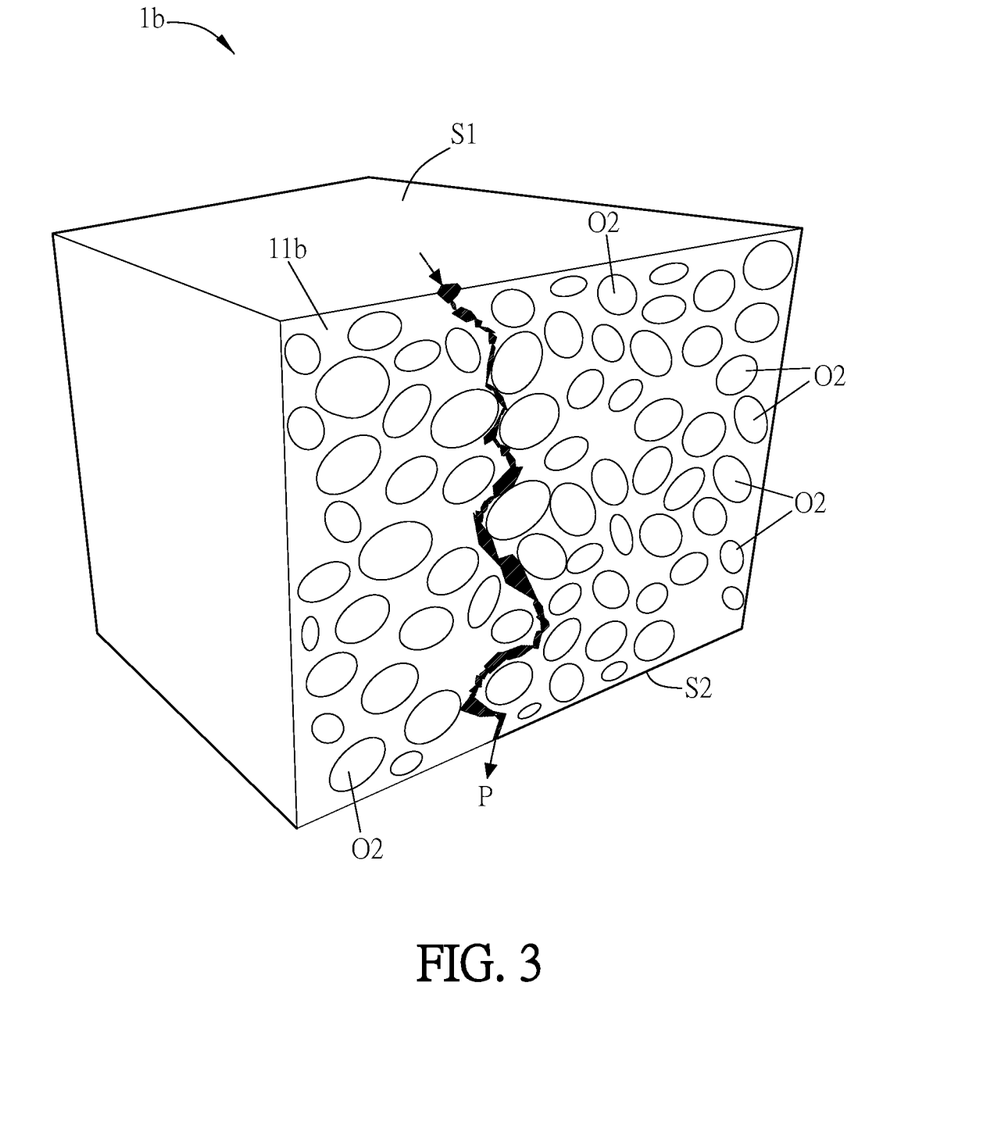
Figure 4:
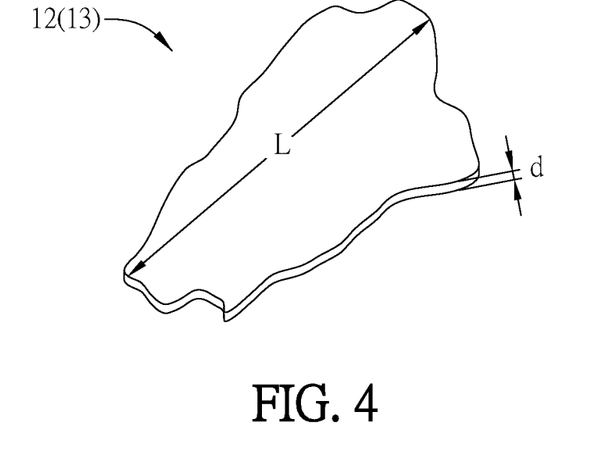
FIG. 4 is a schematic diagram showing the first thermal conductive member or the second thermal conductive member of the elastic heat-dissipation structure according to an embodiment of this disclosure.

FIG. 1A is a partial sectional view of an elastic heat-dissipation structure according to an embodiment of this disclosure, FIG. 1B is an enlarged view of the area A of FIG. 1A, FIGS. 2 and 3 are partial sectional views of elastic heat-dissipation structures according to different embodiments of this disclosure, and FIG. 4 is a schematic diagram showing the first thermal conductive member or the second thermal conductive member of the elastic heat-dissipation structure according to an embodiment of this disclosure. The porous elastic members shown in FIGS. 1A, 2 and 3 have different densities, and each of FIGS. 1A, 2 and 3 only shows one possible heat-dissipation path P in the elastic heat-dissipation structure.

As shown in FIGS. 1A and 1B, the elastic heat-dissipation structure 1 comprises a porous elastic member 11, a plurality of thermal conductive members 12, and a plurality of thermal conductive members 13.

The porous elastic member 11 is a foaming material and has elasticity. The porous elastic member 11 comprises a plurality of pores O1 and O1. The material of the porous elastic member 11 can be the same as the common foaming material such as, for example but not limited to, acrylic resin, polyurethane (PU), polyethylene (PE), polypropylene (PP), ethylene-propylene-diene monomer (EPDM), EVA resin, or any combination thereof. Among the above-mentioned materials, acrylic resin and polyurethane can form the pores having the bubble shapes of semi-closed cells, so that the manufactured porous elastic member 11 can have better softness, compressibility, vibration absorption ability, and heat stability. Alternatively, polyethylene and polypropylene can form the pores having the bubble shapes of closed cells, so that the manufactured porous elastic member 11 can have better humidity stability but worse compressibility and vibration absorption ability.

The first thermal conductive members 12 and the second thermal conductive members 13 are mixed in the porous elastic member 11. In this embodiment, the first thermal conductive members 12 and the second thermal conductive members 13 can be made of high thermal conductive materials, and can be particles, powders, or microchips. The material of the first thermal conductive members 12 and the second thermal conductive members 13 can be, for example but not limited to, graphene, graphite, carbon nanotube, aluminum oxide, zinc oxide, titanium oxide, or boron nitride, or any combination thereof.

The materials for the first thermal conductive members 12 and the second thermal conductive members 13 can be selected with reference to the experimental comparison results listed in the following table 1. The materials including fullerene, carbon nanotube, graphene, and boron nitride are compared in their characteristics such as crystal type, density, cost and specific surface area. It is found that fullerene has a spherical shape and poor heat conductive effect. Carbon nanotube has a lone tube shape, which may interfere the generation of pores during the foaming process of the porous elastic member 11. Boron nitride has a spherical shape and is hard, so the vibration absorption ability thereof is worse. The graphene microchips have the low density, low cost and better vibration absorption ability. Moreover, the contact areas between the graphene microchips are larger than the other materials, so the thermal conductivity and heat dissipation effects of the graphene microchips are better.

TABLE 1

| Material | Fullerene (C60) | Carbon nanotube | Graphene | Boron nitride (BN) |
| --- | --- | --- | --- | --- |
| Hybrid orbital | Sp$^2$ + sp$^3$ | Sp$^2$ + sp$^3$ | Sp$^2$ | — |
| Crystal type | Face-centered cubic packing | Planar triangular lattice | Hexagonal plane | Hexagonal or cubic |
| Chain length/nm | 0.140(C═C) 0.146(C—C) | 0.1444(C═C) | 0.142(C═C) | 0.157(B—N) |
| Density (g/cm$^3$) | 1.72 | 1.5~2.0 | 1.2 | 2.18 |
| Cost | high | middle | low | Low |
| Specific surface area (m$^2$/g) | 1100~1400 | 120~500 | 1500~2600 | 300~1500 |

Specifically, the graphene microchips have five advantages as follow: (1) thin (the thickness is between 0.3 nm and 3 nm), small (the length is tens μm or less), and easily to form the closest stack for maximizing the contact area and facilitating the heat transfer without affecting the formation of the pores; (2) low density, so the foaming upwardly is easily without blocks; (3) high Young's modulus, so the strength of the porous elastic member 11 can be increased; (4) maximum specific surface area to provide high thermal conductivity; and (5) having a two-dimensional structure in X and Y directions, which can increase the additional vertical heat transfer path. Accordingly, the first thermal conductive members 12 and the thermal conductive members 13 of the elastic heat-dissipation structure 1 of this embodiment are made of graphene microchips.

In addition, the elastic heat-dissipation structure 1 further comprises a first surface S1 and a second surface S2 opposite to the first surface S1. The porous elastic member 11 comprises a plurality of pores O1 and O2. The pores O1 are disposed on the first surface S1 or the second surface S2, and can directly communicate with the environment. The pores O1 can be named as the open pores. The pores O2 are not disposed on neither the first surface S1 nor the second surface S2, which means that the pores O2 are disposed inside the porous elastic member 11. In this embodiment, a part of the pores O2 are communicated with the environment through the pores O1 disposed on the first surface S1 or the second surface S2. These pores O2 are named as semi-closed pores, and the width thereof is between 5 μm and 40 μm. The porous elastic member 11 is a low density structure. To be noted, the "semi-closed pores" refer to a part of the pores O2 communicated with the pores O1 disposed on the first surface S1 or the second surface S2.

In another embodiment, as shown in FIG. 2, all of the pores O2 are disposed between the first surface S1 and the second surface S2, and are not communicated with the environment. In other words, there is no or almost no pores O1 disposed on the first surface S1 or the second surface S2. In addition, a part of the pores O2 are communicated with each other. With respect to the porous elastic member 11, the porous elastic member 11a is a middle-density structure, and the communicated pores are disposed therein. In another embodiment, as shown in FIG. 3, all of the pores O2 are disposed between the first surface S1 and the second surface S2, and are not communicated with the environment. In other words, there is no pores O1 disposed on the first surface S1 or the second surface S2. In addition, the pores O2 are isolated from each other and are not communicated with each other. These pores O2 are closed pores. With respect to the porous elastic members 11 and 11a, the porous elastic member 11b is a high-density structure.

In the elastic heat-dissipation structures 1, 1a and 1b, the porous elastic members 11, 11a and 11b are all mixed with the first thermal conductive members 12 and the thermal conductive members 13 (e.g. graphene microchips), so that the elastic heat-dissipation structures 1, 1a and 1b all have good heat conductivities. In addition, since the middle-density and high-density porous elastic members 11a and 11b do not have the pores O1 disposed on the first surface S1 or the second surface S2, the waterproof function thereof is better than that of the low-density porous elastic member 11. On the contrary, the low-density porous elastic member 11 has a plurality of pores O1 disposed on the first surface S1 or the second surface S2, and some pores O2 are communicated with the pores O1, so the heat transfer efficiency of the porous elastic member 11 is superior to that of the porous elastic member 11a or 11b.

In the elastic heat-dissipation structures 1, 1a and 1b of FIGS. 1A, 1B, 2 and 3, the first thermal conductive members 12 and the thermal conductive members 13 (e.g. graphene microchips) are uniformly mixed in the porous elastic members 11, 11a and 11b. In practice, the graphene microchips can be used as the pore former during the foaming procedure of the porous elastic members 11, 11a and 11b. The graphene microchips can be located around the pores O for maintaining the structures of the pores O, thereby remaining the elasticity and buffer ability of the porous elastic members 11, 11a and 11b. Moreover, during the heat guiding and transferring, the graphene microchips located around the pores O1 or O2 (the first thermal conductive members 12 and the thermal conductive members 13) can form the heat dissipation paths P. Assuming that the heat source contacts the first surface S1, the heat can be transferred from one side of the elastic heat-dissipation structure 1, 1a or 1b (the heat source side, e.g. the side of the first surface S1) to the other side thereof (e.g. the side of the second surface S2).

In the above embodiments, regarding any of the low-density, middle-density and high-density porous elastic members 11, 11a and 11b, in order to achieve the good heat absorption, heat conduction or heat dissipation effect, as shown in FIG. 4, this disclosure further discloses the following limitations. Each of the first thermal conductive members 12 has a maximum width L greater than 5 μm and less than or equal to 50 μm (5 μm<L≤50 μm), and each of the second thermal conductive members 13 has a maximum width L greater than 0 μm and less than or equal to 5 μm (0<L≤5 μm). The thickness d of each of the first thermal conductive members 12 and each of the second thermal conductive members 13 is greater than or equal to 0.3 nm and less than or equal to 30 nm (0.3 nm<d≤30 nm). Taking the graphene microchips as an example, the maximum width L is the length of the graphene microchip. Taking the carbon nanotubes as an example, the maximum width L is the axial length of the carbon nanotube. Taking aluminum oxide, zinc oxide, titanium oxide, or boron nitride as an example, the maximum width L is the diameter.

In addition, when a total amount of the first thermal conductive members 12 and the second thermal conductive members 13 is 100%, a percentage of the first thermal conductive members 12 in the total amount is between 5% and 95% (5%≤percentage of the first thermal conductive members 12 ≤95%, the residual part is percentage of the second thermal conductive members 13). For example, if the percentage of the first thermal conductive members 12 is 90%, the percentage of the second thermal conductive members 13 is 10% (totally 100%, mixing ratio is 9:1). If the percentage of the first thermal conductive members 12 is 80%, the percentage of the second thermal conductive members 13 is 20% (totally 100%, mixing ratio is 4:1). Based on the above-mentioned limitations, the first thermal conductive members 12 and the second thermal conductive members 13 (graphene microchips) can be mixed in the porous elastic member 11 in the way of "closest pack" (see FIG. 1B). In the "closest pack", the first thermal conductive members 12 and the second thermal conductive members 13 can have the maximum contact area, thereby achieving better heat transfer effect.

In addition, this disclosure can further have the limitations in the density of the elastic heat-dissipation structure and the percentages of the first thermal conductive members and the second thermal conductive members. For example, when the density of the elastic heat-dissipation structure 1, 1a or 1b is greater than greater than or equal to 0.1 g/cm$^3$ and less than or equal to 1.0 g/cm$^3$ (0.1 g/cm$^3$≤density ≤1.0 g/cm$^3$), the contained percentages of the first thermal conductive members 12 and the second thermal conductive members 13 are greater than or equal to 0.01% and less than or equal to 20% (0.01%≤contained percentages ≤20%). When the density of the elastic heat-dissipation structure 1, 1a or 1b is greater than greater than or equal to 1 g/cm$^3$ and less than or equal to 2 g/cm$^3$ (1.0 g/cm$^3$<density ≤2.0 g/cm$^3$), the contained percentages of the first thermal conductive members 12 and the second thermal conductive members 13 are greater than 20% and less than or equal to 40% (20%<contained percentages ≤40%). When the density of the elastic heat-dissipation structure 1, 1a or 1b is greater than 2 g/cm$^3$ and less than or equal to 4 g/cm$^3$ (2.0 g/cm$^3$<density ≤4.0 g/cm$^3$), the contained percentages of the first thermal conductive members 12 and the second thermal conductive members 13 are greater than 40% and less than or equal to 50% (40%<contained percentages ≤50%). When the density of the elastic heat-dissipation structure 1, 1a or 1b is greater than 4 g/cm$^3$ and less than or equal to 10 g/cm$^3$ (4.0 g/cm$^3$<density ≤10.0 g/cm$^3$), the contained percentages of the first thermal conductive members 12 and the second thermal conductive members 13 are greater than 50% and less than or equal to 60% (50%<contained percentages ≤60%).

According to the above-mentioned limitations, the elastic heat-dissipation structure 1, 1a or 1b can have good heat absorption, heat conduction or heat dissipation effect, and can absorb the vibration as the device is operating. In addition, when the first thermal conductive members 12 and the second thermal conductive members 13 are made of graphene microchips, the elastic heat-dissipation structure 1, 1a or 1b can further have the electromagnetic wave shielding function due to the electromagnetic wave absorption ability of the graphene material. Moreover, this disclosure can be applied to provide the high-density, middle-density or low-density structure according to the heat-dissipation requirement of the device.

The manufacturing procedure of the elastic heat-dissipation structure will be described hereinafter. In some embodiments, the fully hydrolyzed PVA (polyvinyl alcohol, e.g. 1700 DP) is selected as the reactor, and graphene microchips with the above-mentioned limitations (length and thickness) are used as the pore former. Accordingly, the elastic heat-dissipation structures with different densities can be manufactured by controlling the amount of the reactor and the manufacturing conditions. In this embodiment, PVA is about 6~7 wt % in the reaction solution, and then formaldehyde and sulfuric acid are added to perform the acetal reaction at about 60° C. Accordingly, the porous heat-dissipation structure containing graphene heat conductive materials can be obtained.

In one example, 6 wt % polyvinyl alcohol is and 5g graphene are selected to manufacture the porous heat-dissipation structure. Step 1: turn on the hot air circulation oven, control the temperature at 60° C., and preheat the mold. Step 2: put 27g polyvinyl alcohol powder and 5g graphene in a 500 mL beaker. Step 3: add 190 ml deionized water (pure water) to the beaker of step 2. Step 4: heat and stir the reaction mixture in the beaker of step 3 until boiling and dissolved. Step 5: add 20 mL deionized water to a 50 mL beaker. Step 6: add 27 mL formaldehyde solution to a 50 mL beaker. Step 7: after the polyvinyl alcohol in the beaker of step 4 is completely dissolved, continue to stir, and cool down the solution to 85° C. at room temperature. Step 8: after the step 7, slowly add the solution of step 5 into the beaker of step 7, fully mix the mixture, continuously stir, and cool to 75° C. at room temperature. Step 9: add the formaldehyde solution of step 6 into the beaker of step 8, fully mix, and add deionized water until the solution is 280 mL. Step 10: continuously stir, and cool the solution to 60° C. at room temperature. Step 11: add 15 mL sulfuric acid solution (50 wt %) and 5 mL deionized water into a beaker. Step 12: after step 10, add the sulfuric acid solution of step 11 into the beaker of step 10, and stir and mix the solution. Step 13: after the step 12, place the reaction solution in a preheated mold, and placed the mold in a hot air circulation oven at 60° C. for 8 hours. Step 14: after the step 13, place the sample at room temperature until the sample is cooled to room temperature, and wash the sample repeatedly with deionized water until the pH value of the sample is between 6.0 and 7.0. Step 15: after the step 14, the sample is sealed in a zipper bag under wet conditions to obtain an elastic heat-dissipation structure of the porous polyvinyl acetal.

Figure 5:
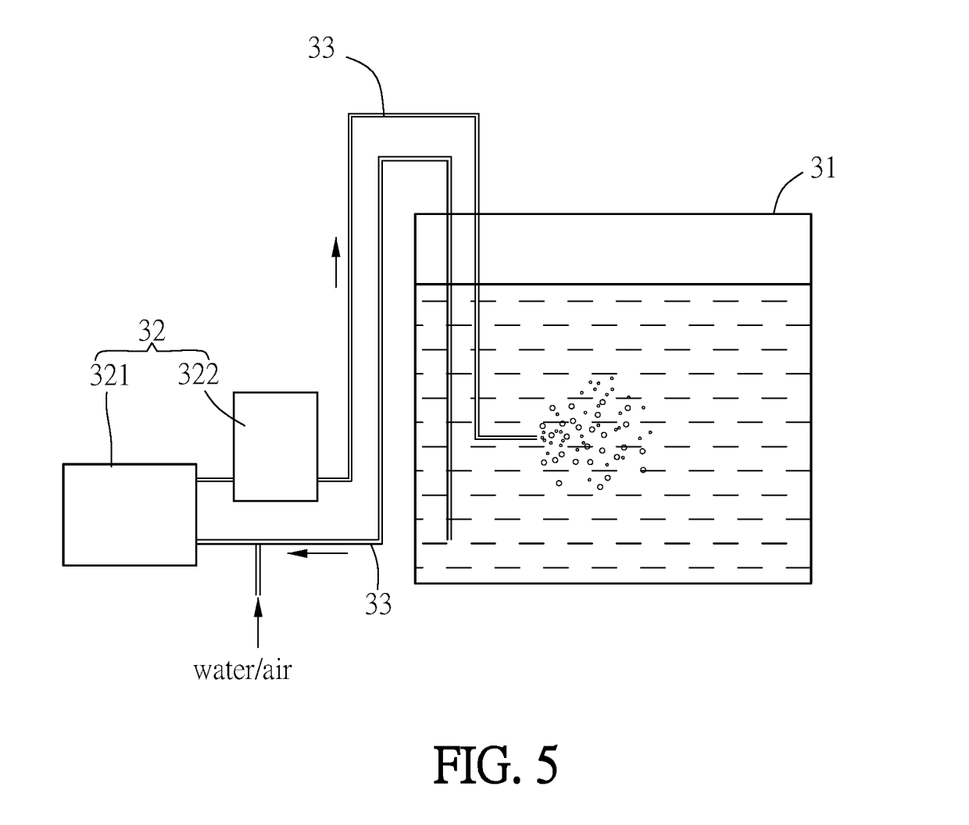
FIG. 5 is a schematic diagram showing the manufacturing machine of the elastic heat-dissipation structure according to an embodiment of this disclosure.

In other embodiments, the porous elastic member can be made of acrylic resin materials, and the first thermal conductive members and the second thermal conductive members are still made of graphene microchips. Referring to FIG. 5, the manufacturing method of the elastic heat-dissipation structure comprises steps of: mixing and stirring graphene microchips and acrylic resin slurry in a proper ratio in a tank 31; activating a micro-bubble generator 32 (comprising a pump 321 and a tank 322) to generate micro bubbles and sending the micro bubbles into the slurry in the tank 31 through a pipe 33 and a nozzle, so that the slurry in the tank 31 contains a lot of micro bubbles; connecting the tank 31 to a dispensing machine for dispensing the slurry (containing a lot of micro bubbles) on a substrate; and performing the drying and curing processes for forming the elastic heat-dissipation structure containing the graphene material on the substrate.

In some embodiments, the elastic heat-dissipation structure can be fabricated in different sizes (different lengths, widths and/or height) based on the requirements for heat conduction, heat dissipation, space, and/or vibration absorption of various electronic devices. In some embodiments, the elastic heat-dissipation structure can be very thin and light. In addition, since the elastic heat-dissipation structure of the disclosure has good elasticity and is compressible, it is possible to apply a proper force to press the elastic heat-dissipation structure onto the heat source to fit the entire thickness of the electronic device. Accordingly, the elastic heat-dissipation structure can provide good heat absorption, heat conduction and heat dissipation effects, thereby achieving the desired vibration absorption and heat dissipation functions and satisfying the demand of thin, large and high performance electronic device. In some embodiments, the elastic heat-dissipation structure is a flexible structure, so that it can be curved or bent to fit the profile of the heat source. This feature can properly guide the heat from the heat source as well as absorbing the generated vibration or noise during operation.

In some embodiments, the first surface S1 or the second surface S2 of the elastic heat-dissipation structure can be attached to the heat source through an adhesive (e.g. a double-sided adhesive), so that the elastic heat-dissipation structure can be disposed between the heat source and the casing, the back plate or the back cover. This configuration can provide the vibration absorption effect, and the heat generated by the heat source can be rapidly transferred to the opposite surface through the adhesive and the elastic heat-dissipation structure, and then dissipated to the environment through the casing, the back plate or the back cover. In some embodiments, the elastic heat-dissipation structure can be directly attached onto the heat source, and this disclosure is not limited thereto. In addition, the elastic heat-dissipation structure of this embodiment can be applied to the heat dissipation and vibration absorption of the electronic device such as, for example but not limited to, a mobile phone, a notebook computer, a tablet computer, a television, a display device, a backlight module, or a lighting module, or an electronic device in other fields.

Figure 6:
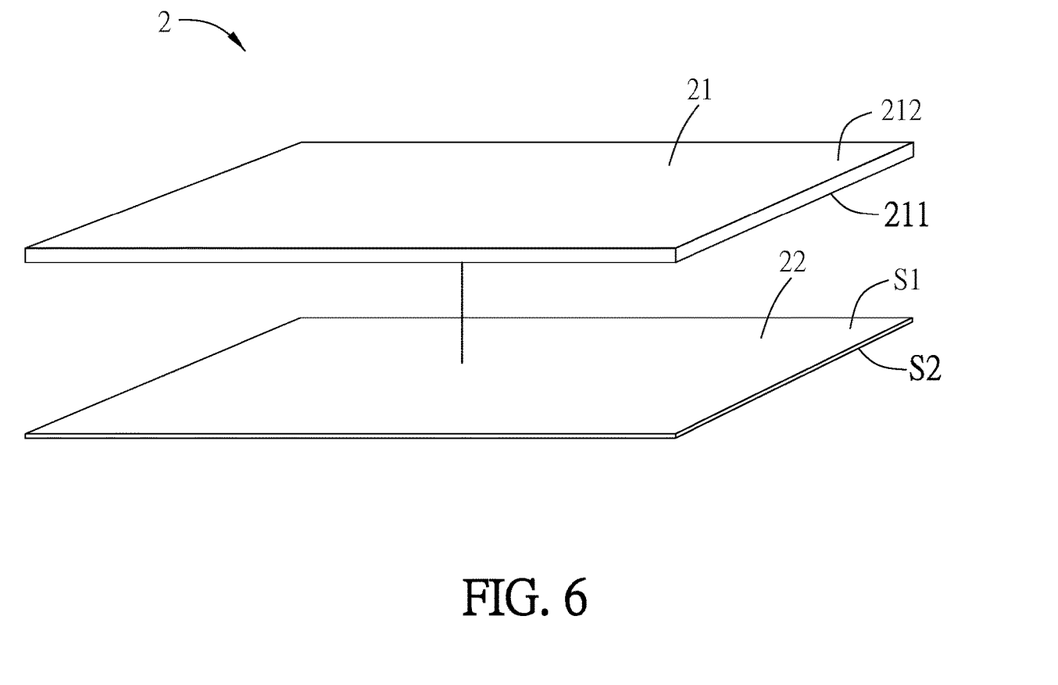
FIG. 6 is a schematic diagram showing an electronic device according to an embodiment of this disclosure.

FIG. 6 is a schematic diagram showing an electronic device according to an embodiment of this disclosure. The electronic device 2 can be, for example but not limited to, a flat display device or a flat light source. In this embodiment, the electronic device 2 comprises a heat source 21 and an elastic heat-dissipation structure 22. The heat source 21 has two opposite surfaces 211 and 212, and the elastic heat-dissipation structure 22 is disposed on the surface 211 of the heat source 21. Herein, the elastic heat-dissipation structure 22 can be any of the above-mentioned elastic heat-dissipation structures 1, 1a and 1b, or any of their modifications. The technical contents thereof can be referred to the above embodiments, so the detailed descriptions thereof will be omitted.

In some embodiments, the electronic device 2 is a flat display device such as, for example but not limited to, an LED display device, an OLED display device, or an LCD device. The heat source 21 is the display panel, which has a display surface (i.e. the surface 212) and a back surface (i.e. the first surface 211). The elastic heat-dissipation structure 22 can be directly or indirectly (e.g. through the adhesive) attached to the surface 211 of the heat source 21, so that the elastic heat-dissipation structure 22 can absorb the heat and vibration generated by the heat source 21. In some cases, the press or contact operation of the display panel can generate the vibration. In some other embodiments, the electronic device 2 is a flat light source such as, for example but not limited to, a backlight module, an LED lighting module, or an OLED lighting module. The heat source 21 is the lighting element, which has a light output surface (i.e. the surface 212) and a back surface (i.e. the first surface 211). The elastic heat-dissipation structure 22 can be directly or indirectly (e.g. through the adhesive) attached to the surface 211 of the heat source 21.

A heat dissipation test of an electronic device of an embodiment will be described hereinafter. The heat source 21 is, for example, an OLED panel, and the temperature of the surface 211 (back surface) is, for example, 54.8° C. When attaching a general foam on the surface 211, the temperature of the surface of the foam away from the surface 211 (the temperature of the lower surface) is 39.7° C., which means the general foam has poor heat conductivity. However, when attaching the first surface S1 of the above-mentioned elastic heat-dissipation structure 22 to the surface 211 of the heat source 21, the second surface S2 of the elastic heat-dissipation structure 22 can reach up to 45.2° C. This experiment indicates that the elastic heat-dissipation structure 22 has a better heat conductivity effect than the general foam (5.5° C. more), so that the elastic heat-dissipation structure 22 can more efficiently dissipate the heat generated by the heat source 21 to the environment.

In some applications, the elastic heat-dissipation structure 22 has good elasticity and buffer ability. When the elastic heat-dissipation structure 22 is pressed on the heat source 21 according to the requirement (e.g. the requirement for fitting the thickness of the electronic device), the first thermal conductive members and the second thermal conductive members of the elastic heat-dissipation structure 22 are pressed to provide a larger contact area and to be closer to the heat source 21. Accordingly, the heat can be more rapidly transferred from the first surface S1 to the second surface S2 and then dissipated to the environment.

FIGS. 7A to 7F are schematic diagram showing the applications of the elastic heat-dissipation structure of this disclosure for heat dissipation and damping of a display device.

Figure 7A:
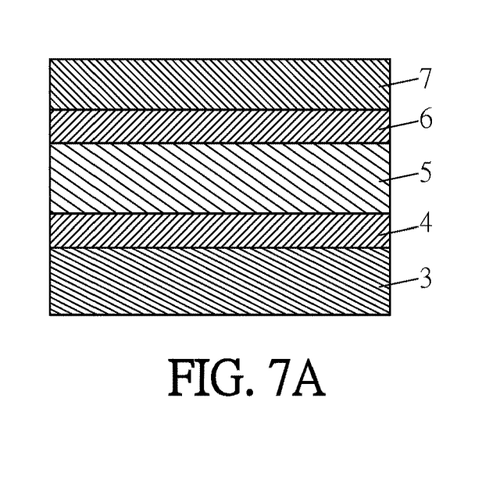
FIGS. 7A to 7F are schematic diagram showing the applications of the elastic heat-dissipation structure of this disclosure for heat dissipation and damping of a display device.

In some applications, as shown in FIG. 7A, an adhesive layer 4 (e.g. a double-sided adhesive), a heat-dissipation film 5, another adhesive layer 6 (e.g. a double-sided adhesive), and an elastic heat-dissipation structure 7 (any of the above-mentioned embodiments or their combinations) are stacked on the back surface of the display device 3 in order. Herein, the display device 3 is the heat source, and the back surface of the display device 3 is opposite to the display surface of the display device 3.

Figure 7B:
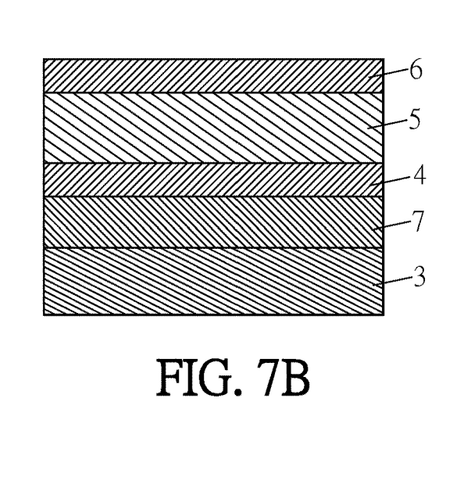

In addition, as shown in FIG. 7B, an elastic heat-dissipation structure 7, an adhesive layer 4, a heat-dissipation film 5, and another adhesive layer 6 are stacked on the back surface of the display device 3 in order. Herein, the back surface of the display device 3 is opposite to the display surface of the display device 3.

Figure 7C:
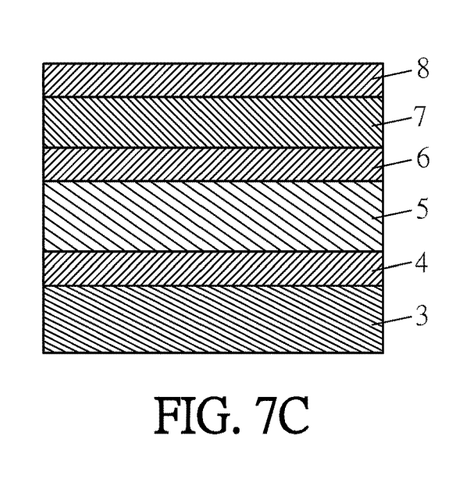

In addition, as shown in FIG. 7C, an adhesive layer 4, a heat-dissipation film 5, another adhesive layer 6, an elastic heat-dissipation structure 7, and another adhesive layer 8 are stacked on the back surface of the display device 3 in order. Herein, the back surface of the display device 3 is opposite to the display surface of the display device 3.

Figure 7D:
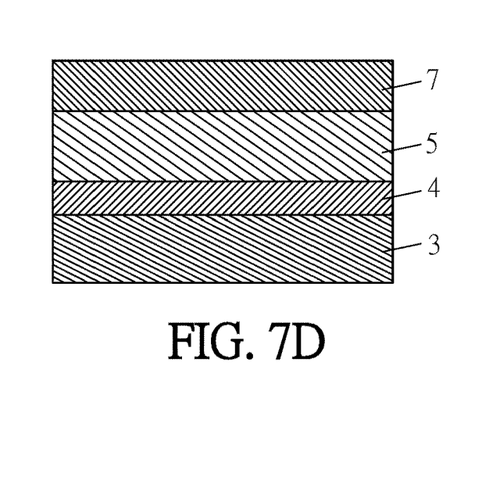

In addition, as shown in FIG. 7D, an adhesive layer 4 (e.g. a double-sided adhesive), a heat-dissipation film 5, and an elastic heat-dissipation structure 7 are stacked on the back surface of the display device 3 in order. Herein, the back surface of the display device 3 is opposite to the display surface of the display device 3.

Figure 7E:
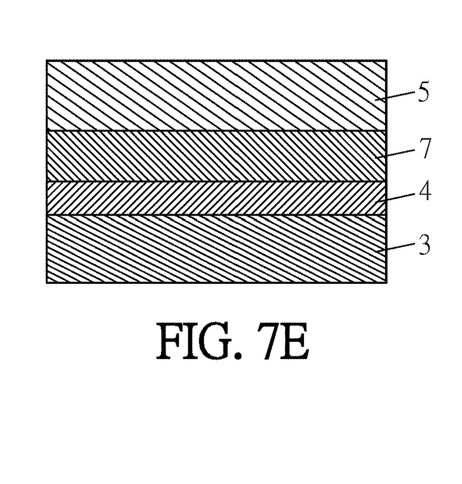

In addition, as shown in FIG. 7E, an adhesive layer 4 (e.g. a double-sided adhesive), an elastic heat-dissipation structure 7, and a heat-dissipation film 5 are stacked on the back surface of the display device 3 in order. Herein, the back surface of the display device 3 is opposite to the display surface of the display device 3.

Figure 7F:
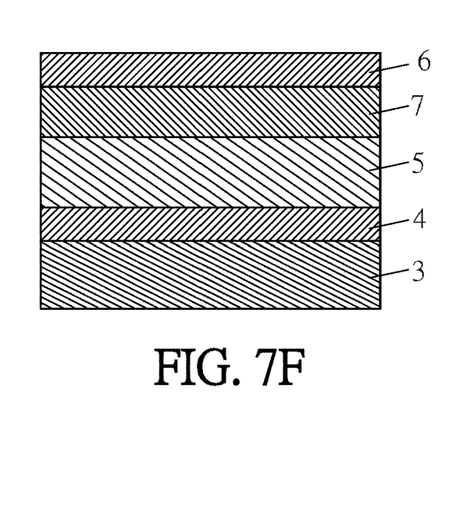
Figure 8A:
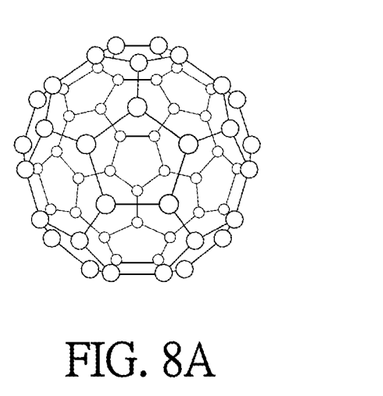
FIG. 8A shows a crystal structure of Fullerene (C60)
Figure 8B:
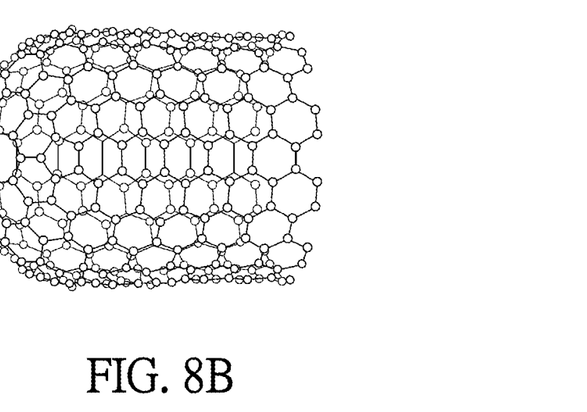
FIG. 8B shows a crystal structure of Carbon Nanotube.
Figure 8C:
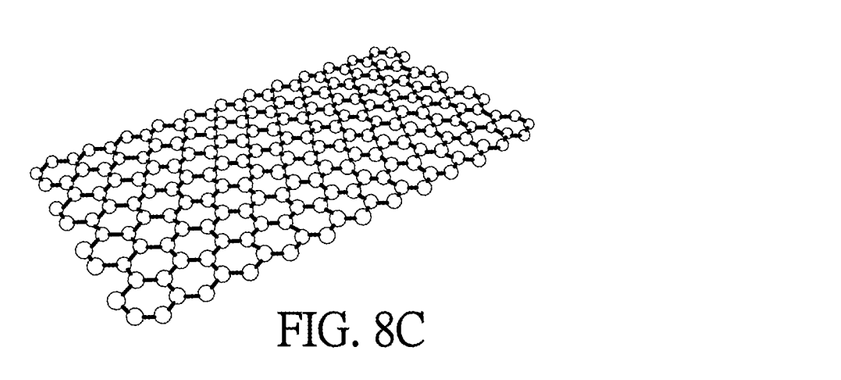
FIG. 8C shows a crystal structure of Graphene.
Figure 8D:
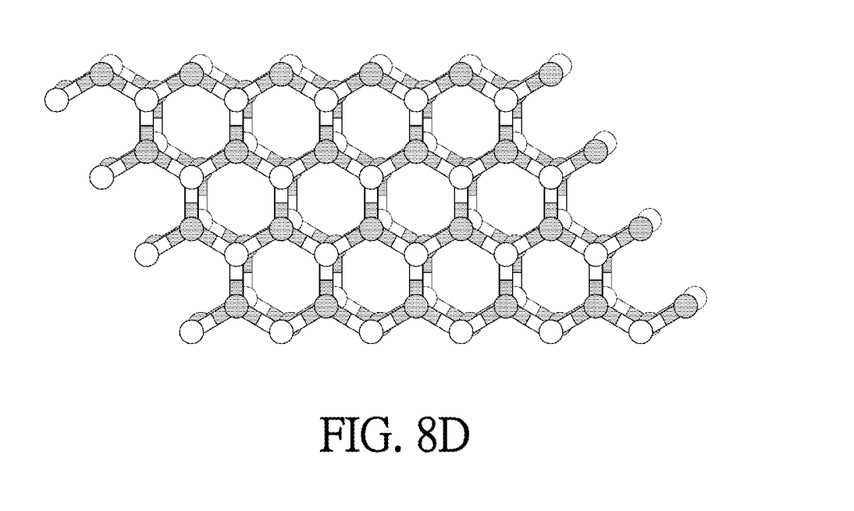
FIG. 8D shows a crystal structure of Boron Nitride (BN).

In addition, as shown in FIG. 7F, an adhesive layer 4, a heat-dissipation film 5, an elastic heat-dissipation structure 7, and another adhesive layer 6 are stacked on the back surface of the display device 3 in order. Herein, the back surface of the display device 3 is opposite to the display surface of the display device 3.

To be noted, the relative positions of the stacked structure including the display device 3 (heat source), the elastic heat-dissipation structure 7, the heat-dissipation film 5, and the adhesive layers 4, 6 and 8 of the above-mentioned aspects are for illustrations only. In other applications, the stacking arrangement of these components can be changed based on the requirements of heat dissipation and damping of the heat source, and this disclosure is not limited thereto.

To sum up, in the elastic heat-dissipation structure and the electronic device of this disclosure, the first thermal conductive members and the second thermal conductive members are mixed and disposed inside the porous elastic member, and the limiting property of the first thermal conductive members and the second thermal conductive members can quickly dissipate the heat generated by the heat source to the environment. Moreover, the elastic heat-dissipation structure can also absorb the vibrations in a single point, a partial area or a plane, thereby achieving heat dissipation and damping functions. In addition, the elastic heat-dissipation structure of this disclosure can satisfy the requirements of thin, large and high performance for the electronic device.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An elastic heat-dissipation structure, comprising:
    a porous elastic member; and
    a plurality of first thermal conductive members and a plurality of second thermal conductive members, wherein the first thermal conductive members and the second thermal conductive members are mixed in the porous elastic member, each of the first thermal conductive members has a maximum width greater than 5 pm and less than or equal to 50 pm, each of the second thermal conductive members has a maximum width greater than 0 pm and less than or equal to 5 pm, a thickness of each of the first thermal conductive members and each of the second thermal conductive members is greater than or equal to 0.3 nm and less than or equal to 30 nm;
    wherein, when a density of the elastic heat-dissipation structure is at least one of greater than or equal to 0.1 g/cm3 and less than or equal to 1.0 g/cm3, contained percentages of the first thermal conductive members and the second thermal conductive members are greater than or equal to 0.01% and less than or equal to 20%; or greater than 1 g/cm3 and less than or equal to 2 g/cm3, the contained percentages of the first thermal conductive members and the second thermal conductive members are greater than 20% and less than or equal to 40%; or greater than 2 g/cm3 and less than or equal to 4 g/cm3, the contained percentages of the first thermal conductive members and the second thermal conductive members are greater than 40% and less than or equal to 50%; or greater than 4 g/cm3 and less than or equal to 10 g/cm3, the contained percentages of the first thermal conductive members and the second thermal conductive members are greater than 50% and less than or equal to 60%.

2. The elastic heat-dissipation structure of claim 1, wherein a material of the porous elastic member comprises acrylic resin, polyurethane, polyethylene, or polypropylene, or any combination thereof.

3. The elastic heat-dissipation structure of claim 1, wherein a material of the first thermal conductive member or the second thermal conductive member comprises graphene, graphite, carbon nanotube, aluminum oxide, zinc oxide, titanium oxide, or boron nitride, or any combination thereof.

4. The elastic heat-dissipation structure of claim 1, wherein when a total amount of the first thermal conductive members and the second thermal conductive members is 100%, a percentage of the first thermal conductive members in the total amount is between 5% and 95%.

5. The elastic heat-dissipation structure of claim 1, further comprising:
    a first surface and a second surface opposite to the first surface;
    wherein the porous elastic member comprises a plurality of pores, and a part of the pores are communicated with an environment through the pores disposed on the first surface or the second surface.

6. The elastic heat-dissipation structure of claim 1, further comprising:
    a first surface and a second surface opposite to the first surface;
    wherein the porous elastic member comprises a plurality of pores, the pores are disposed between the first surface and the second surface and are not communicated with an environment, and a part of the pores are communicated with each other.

7. The elastic heat-dissipation structure of claim 1, further comprising:
    a first surface and a second surface opposite to the first surface;
    wherein the porous elastic member comprises a plurality of pores, the pores are disposed between the first surface and the second surface and are not communicated with an environment, and the pores are isolated from each other.

8. The elastic heat-dissipation structure of claim 1, wherein the porous elastic member comprises a plurality of pores, and the first thermal conductive members and the second thermal conductive members are disposed around the pores for maintaining the pores.

9. An electronic device, comprising:
a heat source; and
an elastic heat-dissipation structure disposed on a surface of the heat source and comprising:
   a porous elastic member, and
   a plurality of first thermal conductive members and a plurality of second thermal conductive members, wherein the first thermal conductive members and the second thermal conductive members are mixed in the porous elastic member, each of the first thermal conductive members has a maximum width greater than 5 um and less than or equal to 50 um, each of the second thermal conductive members has a maximum width greater than 0 um and less than or equal to 5 um, a thickness of each of the first thermal conductive members and each of the second thermal conductive members is greater than or equal to 0.3 nm and less than or equal to 30 nm;
wherein, when a density of the elastic heat-dissipation structure is at least one of greater than or equal to 0.1 g/cm3 and less than or equal to 1.0 g/cm3, contained percentages of the first thermal conductive members and the second thermal conductive members are greater than or equal to 0.01% and less than or equal to 20%; or greater than 1 g/cm3 and less than or equal to 2 g/cm3, the contained percentages of the first thermal conductive members and the second thermal conductive members are greater than 20% and less than or equal to 40%; or greater than 2 g/cm3 and less than or equal to 4 g/cm3, the contained percentages of the first thermal conductive members and the second thermal conductive members are greater than 40% and less than or equal to 50%; or greater than 4 g/cm3 and less than or equal to 10 g/cm3, the contained percentages of the first thermal conductive members and the second thermal conductive members are greater than 50% and less than or equal to 60%.

10. The electronic device of claim 9, wherein a material of the porous elastic member comprises acrylic resin, polyurethane, polyethylene, or polypropylene, or any combination thereof.

11. The electronic device of claim 9, wherein a material of the first thermal conductive member or the second thermal conductive member comprises graphene, graphite, carbon nanotube, aluminum oxide, zinc oxide, titanium oxide, or boron nitride, or any combination thereof.

12. The electronic device of claim 9, wherein when a total amount of the first thermal conductive members and the second thermal conductive members is 100%, a percentage of the first thermal conductive members in the total amount is between 5% and 95%.

13. The electronic device of claim 9, wherein the elastic heat-dissipation structure further comprises a first surface and a second surface opposite to the first surface, the porous elastic member comprises a plurality of pores, and a part of the pores are communicated with an environment through the pores disposed on the first surface or the second surface.

14. The electronic device of claim 9, wherein the elastic heat-dissipation structure further comprises a first surface and a second surface opposite to the first surface, the porous elastic member comprises a plurality of pores, the pores are disposed between the first surface and the second surface and are not communicated with an environment, and a part of the pores are communicated with each other.

15. The electronic device of claim 9, wherein the elastic heat-dissipation structure further comprises a first surface and a second surface opposite to the first surface, the porous elastic member comprises a plurality of pores, the pores are disposed between the first surface and the second surface and are not communicated with an environment, and the pores are isolated from each other.

16. The electronic device of claim 9, wherein the porous elastic member comprises a plurality of pores, and the first thermal conductive members and the second thermal conductive members are disposed around the pores for maintaining the pores.

17. The electronic device of claim 9, wherein the electronic device is an LED display device, an OLED display device, an LCD device, a backlight module, an LED lighting module, or an OLED lighting module.

* * * * *